US012087649B2

(12) United States Patent
Takaya

(10) Patent No.: US 12,087,649 B2
(45) Date of Patent: Sep. 10, 2024

(54) WIRING BASE AND ELECTRONIC DEVICE

(71) Applicant: KYOCERA Corporation, Kyoto (JP)

(72) Inventor: Shigenori Takaya, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 187 days.

(21) Appl. No.: 17/794,761

(22) PCT Filed: Jan. 6, 2021

(86) PCT No.: PCT/JP2021/000188
§ 371 (c)(1),
(2) Date: Jul. 22, 2022

(87) PCT Pub. No.: WO2021/149491
PCT Pub. Date: Jul. 29, 2021

(65) Prior Publication Data
US 2023/0054870 A1  Feb. 23, 2023

(30) Foreign Application Priority Data
Jan. 24, 2020  (JP) ................ 2020-010106

(51) Int. Cl.
*H01L 23/14* (2006.01)
*H01L 23/04* (2006.01)

(52) U.S. Cl.
CPC ............. *H01L 23/14* (2013.01); *H01L 23/04* (2013.01)

(58) Field of Classification Search
CPC ................ H01L 23/14; H01L 23/04
USPC ........................................... 361/783
See application file for complete search history.

(56) References Cited

U.S. PATENT DOCUMENTS

| | | | |
|---|---|---|---|
| 2013/0003314 A1* | 1/2013 | Igarashi | H01L 24/19 29/850 |
| 2015/0216034 A1 | 7/2015 | Kitajima | |
| 2017/0148718 A1* | 5/2017 | Morita | H01L 21/4846 |

FOREIGN PATENT DOCUMENTS

| | | |
|---|---|---|
| CN | 104812160 A | 7/2015 |
| WO | 2014/192687 A1 | 12/2014 |
| WO | 2015/030093 A1 | 3/2015 |

* cited by examiner

*Primary Examiner* — Andargie M Aychillhum
(74) *Attorney, Agent, or Firm* — Volpe Koenig

(57) ABSTRACT

A wiring base includes an insulation base having a first surface, a first differential-wiring channel, and a second differential-wiring channel. The first and the second differential-wiring channels are on the first surface and arranged side by side in a first direction. The first differential-wiring channel includes a pair of first signal conductors extending in a second direction intersecting the first direction and a pair of first grounding conductors extending along the first signal conductors with the first signal conductors being interposed therebetween. The second differential-wiring channel includes a pair of second signal conductors extending in the second direction and a pair of second grounding conductors extending along the second signal conductors with the second signal conductors being interposed therebetween. The wiring base further includes a first film extending in the second direction and positioned between first and second grounding conductors adjacent to each other in plan of the first surface.

13 Claims, 12 Drawing Sheets

FIG. 6
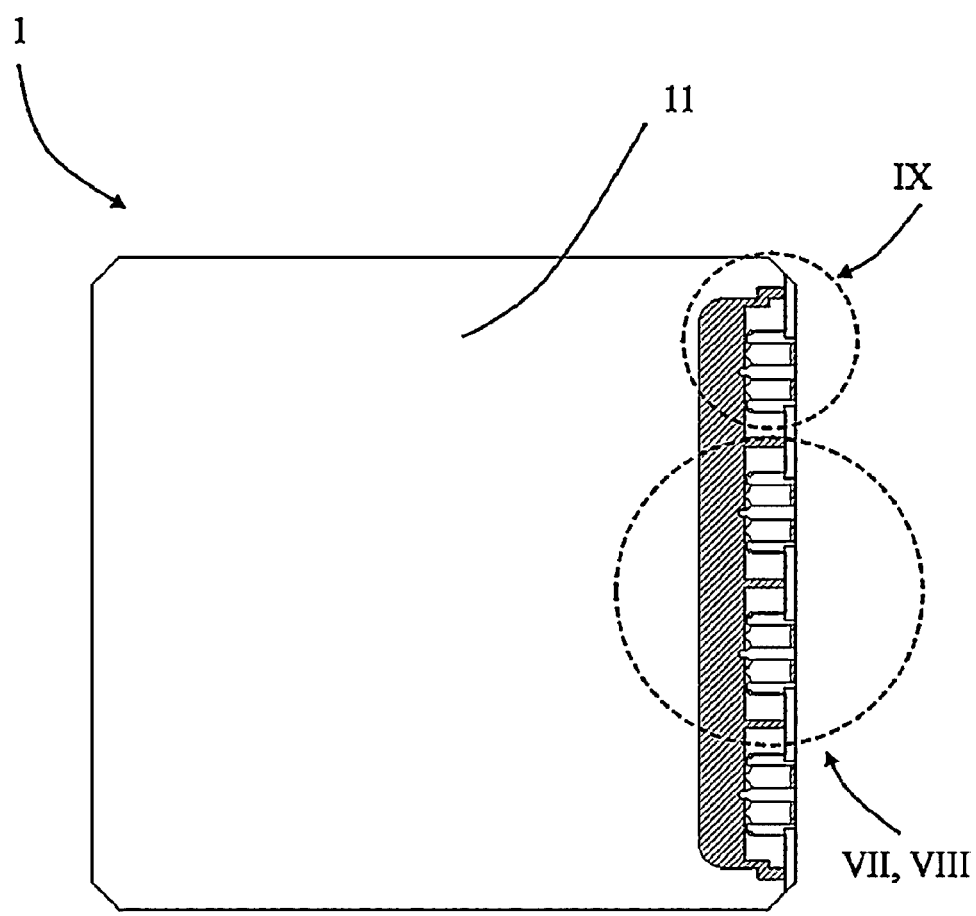
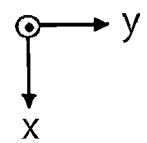

WIRING BASE AND ELECTRONIC DEVICE

TECHNICAL FIELD

The present disclosure relates to a wiring base and an electronic device.

BACKGROUND OF INVENTION

In parallel with high-performance communication terminals becoming popular, electronic devices are subjected to the increase of the frequency of electric signal so that a large amount of data can be transmitted at a high speed. International Publication No. 2014/192687 discloses an input-output terminal in which multiple differential-wiring channels are disposed next to each other to improve the frequency characteristics in a high frequency band.

SUMMARY

In the present disclosure, a wiring base includes an insulation base, a first differential-wiring channel, and a second differential-wiring channel. The insulation base has a first surface. The first differential-wiring channel is positioned on the first surface. The second differential-wiring channel is positioned on the first surface. The first differential-wiring channel and the second differential-wiring channel are arranged side by side in a first direction. The first differential-wiring channel includes a pair of first signal conductors extending in a second direction intersecting the first direction and a pair of first grounding conductors extending along the first signal conductors with the first signal conductors being interposed between the first grounding conductors. The second differential-wiring channel includes a pair of second signal conductors extending in the second direction and a pair of second grounding conductors extending along the second signal conductors with the second signal conductors being interposed between the second grounding conductors. The wiring base further includes a first film extending in the second direction and positioned between a first grounding conductor and a second grounding conductor adjacent to each other when the first surface is viewed in plan.

The electronic device of the present disclosure includes the above-described wiring base and an electronic component connected to the wiring base.

BRIEF DESCRIPTION OF DRAWINGS

FIG. 6 is a plan view illustrating the wiring base according to an embodiment of the present disclosure as viewed from above.

DESCRIPTION OF EMBODIMENTS

The following describes a wiring base 1 and an electronic device 100 according to some example embodiments of the present disclosure with reference to the drawings. In the following description, the electronic device 100 includes the wiring base 1 and an electronic component 101 mounted on the wiring base 1. For a matter of convenience, the present specification may use the xyz orthogonal coordinate system when describing the wiring base 1 and the electronic device 100. In the following description, an upper side may be described as a side facing the positive side in the z direction, and a lower side may be described as a side facing the negative side in the z direction.

<Structure of Wiring Base 1>

Figure 1:
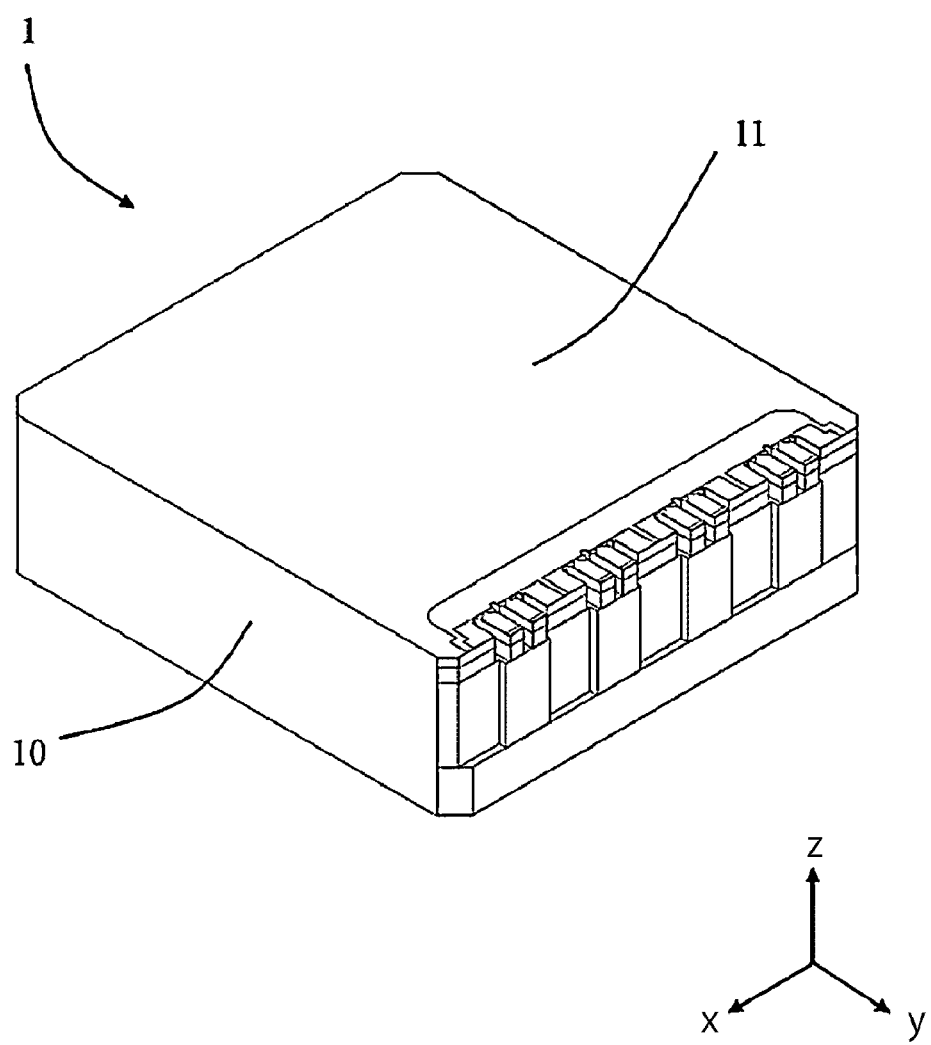
FIG. 1 is a perspective view illustrating a wiring base according to an embodiment of the present disclosure as viewed from above.

The wiring base 1 illustrated in FIG. 1 includes an insulation base 10, a first differential-wiring channel 20, a second differential-wiring channel 30, and a first film 41.

The insulation base 10 may contain a dielectric material. For example, the dielectric material may be a ceramic material, such as an aluminum oxide-based sintered body, a mullite-based sintered body, a silicon carbide-based sintered body, an aluminum nitride-based sintered body, or a silicon nitride-based sintered body, or may be a glass-ceramic material.

The insulation base 10 may be formed of layers of the dielectric material. The layers of the dielectric material as used herein may be referred to as insulation layers in the present specification. The insulation base 10 has a first surface 11. For example, the insulation base 10 may be shaped like a rectangle or like the letter U when the first surface 11 is viewed in plan. The size of the insulation base 10 may be in the range of 2 mm by 2 mm to 25 mm by 50 mm. The height may be in the range of 1 mm to 10 mm. The sizes of the insulation base 10 and the first surface 11 can be set appropriately. In the present specification, the top surface of the insulation base 10 may be referred to as the first surface 11, and a surface opposite to the first surface 11 may be referred to as the bottom surface.

The first differential-wiring channel 20 and the second differential-wiring channel 30 are positioned on the first surface 11. The first differential-wiring channel 20 and the second differential-wiring channel 30 are arranged side by side in the first direction. Note that the first direction corresponds to the x-axis direction in the drawings.

The first differential-wiring channel 20 includes a pair of first signal conductors 21 and a pair of first grounding conductors 22. The first signal conductors 21 extend in the second direction that intersects the first direction. The first grounding conductors 22 extend along the first signal conductors 21 with the first signal conductors 21 being interposed between the first grounding conductors 22. In other words, the first signal conductors 21 and the first grounding conductors 22 are disposed so as to achieve a differential wiring arrangement. More specifically, when the first surface 11 is viewed in plan, the first differential-wiring channel 20 includes a first grounding conductor 22, a first signal conductor 21, a first signal conductor 21, and a first grounding conductor 22 that are arranged in this order. The differential wiring arrangement of the first signal conductors 21 and the first grounding conductors 22 improves the noise resistance of the wiring base 1. Note that the second direction corresponds to the y-axis direction in the drawings. The second direction may orthogonally intersect the first direction.

The second differential-wiring channel 30 includes a pair of second signal conductors 31 and a pair of second grounding conductors 32. The second signal conductors 31 extend in the second direction. The second grounding conductors 32 extend along the second signal conductors 31 with the second signal conductors 31 being interposed between the second grounding conductors 32. In other words, the second signal conductors 31 and the second grounding conductors 32 are disposed so as to achieve a differential wiring arrangement. More specifically, when the first surface 11 is viewed in plan, the second differential-wiring channel 30 includes a second grounding conductor 32, a second signal conductor 31, a second signal conductor 31, and a second grounding conductor 32 that are arranged in this order. The differential wiring arrangement of the second signal conductors 31 and the second grounding conductors 32 improves the noise resistance of the wiring base 1.

The first signal conductors 21 and the second signal conductors 31 extend from the inside of the first surface 11 toward the outside of the insulation base 10 when the first surface 11 is viewed in plan. For a matter of convenience, in the present specification, the outside of the insulation base 10 may be positioned closer to the positive side in the y direction, and the inside of the first surface 11 may be positioned closer to the negative side in the y direction.

The first signal conductors 21 and the second signal conductors 31 are transmission lines through which a high-frequency signal is transmitted. For example, the frequency band of the high-frequency signal may be from 10 to 100 GHz. Lead-out terminals are coupled to the first signal conductors 21 or to the second signal conductors 31. The lead-out terminals being coupled to the first signal conductors 21 or to the second signal conductors 31 function as signal terminals. The lead-out terminals are joined to respective ones of the first signal conductors 21 or the second signal conductors 31 using a bonding material, such as solder or brazing metal. The lead-out terminals are members to be used for electrical connection to an external electric circuit board or the like.

For example, each of the first signal conductors 21 and of the second signal conductors 31 may be shaped like a rectangle when the first surface 11 is viewed in plan and may have a width of 0.1 to 2 mm in the first direction and a width of 0.3 to 10 mm in the second direction. The shape of the first signal conductor 21 and of the second signal conductor 31 is not limited to the rectangle. The width, length, and thickness thereof may be set appropriately.

The first signal conductors 21 and the second signal conductors 31 may be metallized layers formed on the first surface 11. The metallized layers may contain tungsten (W), molybdenum (Mo), manganese (Mn), silver (Ag), or copper (Cu) and may be plated with nickel or gold. The metallized layers may contain an alloy or the like made of at least one of the above metals.

The first grounding conductors 22 and the second grounding conductors 32 are conductors having a ground potential. Lead-out terminals are coupled to the first grounding conductors 22 or to the second grounding conductors 32. The lead-out terminals being coupled to the first grounding conductors 22 or to the second grounding conductors 32 function as ground terminals. The lead-out terminals are joined to respective ones of the first grounding conductors 22 or to the second grounding conductors 32 using a bonding material, such as solder or brazing metal.

For example, each of the first grounding conductors 22 and of the second grounding conductors 32 may be shaped like a rectangle when the first surface 11 is viewed in plan and may have a width of 0.1 to 2 mm in the first direction and a width of 0.3 to 10 mm in the second direction. The shape of the first grounding conductor 22 and of the second grounding conductor 32 is not limited to the rectangle. The width, length, and thickness thereof can be set appropriately.

The first grounding conductors 22 and the second grounding conductors 32 may be metallized layers formed on the first surface 11. The metallized layers may contain tungsten (W), molybdenum (Mo), manganese (Mn), silver (Ag), or copper (Cu) and may be plated with nickel or gold. The metallized layers may contain an alloy or the like made of at least one of the above metals.

One conductor positioned on the first surface 11 may be coupled to respective ones of the pair of first grounding conductors 22 at positions closer to the negative side in the y-axis direction. Another conductor positioned on the first surface 11 may be coupled to respective ones of the pair of second grounding conductors 32 at positions closer to the negative side in the y-axis direction. This increases the area of the grounded surface, thereby enabling the wiring base 1 to have stable high-frequency characteristics. When the pair of first grounding conductors 22 is coupled to the one conductor and the pair of second grounding conductors 32 is coupled to the other conductor, the first grounding conductors 22 may form a shape like the letter U and the second grounding conductors 32 may also form a shape like the letter U when the first surface 11 is viewed in plan. The one conductor above may be coupled to ends of the first signal conductors 21, and the other conductor above may be coupled to ends of the second signal conductors 31. In this case, the ends of the first signal conductors 21 and the ends of the second signal conductors 31 are both positioned closer to the negative side of the wiring base 1 in the y-axis direction when the first surface 11 is viewed in plan.

A first grounding conductor 22 and a second grounding conductor 32 next to each other may be positioned away from each other or may be coupled to a third grounding conductor 50 to be described later. When the first and second grounding conductors 22 and 32 next to each other are integrated into one, the area of the grounded surface of the first grounding conductor 22 and the second grounding conductor 32 can be increased, which enables the wiring base 1 to have stable high-frequency characteristics.

For a matter of convenience, in the present specification, the term "signal conductors" having no reference signs may refer to both of the first signal conductors 21 and the second signal conductors 31. Similarly, for a matter of convenience, in the present specification, the term "grounding conductors" having no reference signs may refer to both of the first grounding conductors 22 and the second grounding conductors 32.

A second recess 15 may be positioned between signal conductors in each pair. A third recess 16 may be positioned between a first signal conductor 21 and a first grounding conductor 22 and between a second signal conductor 31 and a second grounding conductor 32. Each second recess 15 and each third recess 16 open at the first surface 11. The space in the second recess 15 and the space in the third recess 16 are electrically insulated, which can lower the effective dielectric constant in the vicinity of each signal conductor and can make it easier to achieve impedance matching of the wiring base 1. Successful impedance matching enables the wiring base 1 to transmit high-frequency signals stably.

The second recess 15 and the third recess 16 may be formed so as to cut the insulation base 10, by machining or the like, from the first surface 11 to the bottom surface that is opposite to the first surface 11. When the insulation base 10 is made of layers of the dielectric material, a layer or layers of the dielectric material may be cut, by using a die, punching, laser light, or the like, at positions corresponding to the second recesses 15 and the third recesses 16, and the layers of the dielectric material may be laminated thereafter.

Each second recess 15 and each third recess 16 may be shaped like rectangles when the first surface 11 is viewed in plan. Each second recess 15 and each third recess 16 may be shaped like semicircles or semiellipses when the first surface 11 is viewed in plan. This alleviate the stress concentration at corners, compared with the second recess 15 and the third recess 16 shaped like rectangles. Alleviation of the stress concentration at corners makes the wiring base 1 less vulnerable to crack formation. In addition, when the first surface 11 is viewed in plan, a hollow 17 may be positioned at the end of each second recess 15 and at the end of each third recess 16. The effective dielectric constant near the first signal conductor 21 and the second signal conductor 31 can be further lowered by forming the hollow 17. As a result, the impedance matching of the wiring base 1 can be achieved more easily. Successful impedance matching enables the wiring base 1 to transmit high-frequency signals more stably. The hollow 17 may have a rectangular shape when the first surface 11 is viewed in plan. Alternatively, the hollow 17 may have a semicircular or semielliptic shape when the first surface 11 is viewed in plan. This alleviates the stress concentration at corners, compared with the hollow 17 being rectangular, which makes the wiring base 1 less vulnerable to crack formation.

First recesses 13 may be positioned at the periphery of the insulation base 10 and at respective tip ends of the grounding conductors when the first surface 11 is viewed in plan. Due to the formation of the first recesses 13, the grounding conductors can be elongated easily in the z direction, which can increase the area of the grounded surface. The increase of the area of the grounded surface enables the wiring base 1 to have stable high-frequency characteristics.

The first recess 13 may be provided at the position corresponding to each grounding conductor. Alternatively, one first recess 13 may be provided for a set of a first grounding conductor 22 and a second grounding conductor 32 next to each other. When one first recess 13 is provided for the set of the first grounding conductor 22 and the second grounding conductor 32, the first grounding conductor 22 and the second grounding conductor 32 can be connected to each other by another conductor positioned in the z direction therefrom, which can improve the high-frequency characteristics of the wiring base 1.

The depth of the first recess 13 in the z-axis direction may be greater than the depth of the second recess 15 and than the depth of the third recess 16 in the z-axis direction. This can enlarge the region of the grounding conductor positioned in the z direction in the first recess 13, which enables the area of the grounded surface to increase. The increase of the area of the grounded surface can make it easier to achieve impedance matching of the wiring base 1. Successful impedance matching enables the wiring base 1 to transmit high-frequency signals stably.

The first recess 13 may have a width of 0.3 to 5 mm in the x-axis direction, a width of 0.05 to 1 mm in the y-axis direction, and a depth of 0.5 to 10 mm in the z-axis direction.

Figure 3:
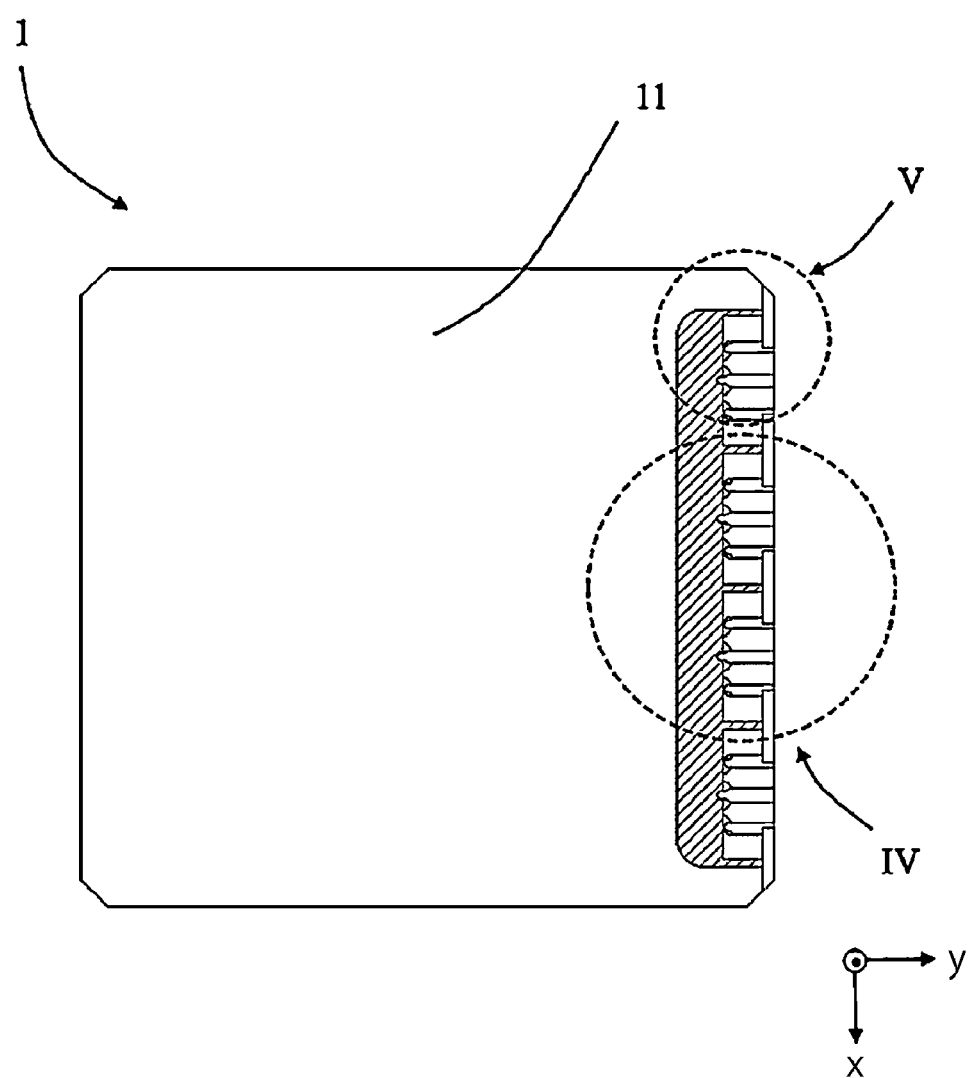
FIG. 3 is a plan view illustrating the wiring base according to the embodiment of the present disclosure as viewed from above.
Figure 4:
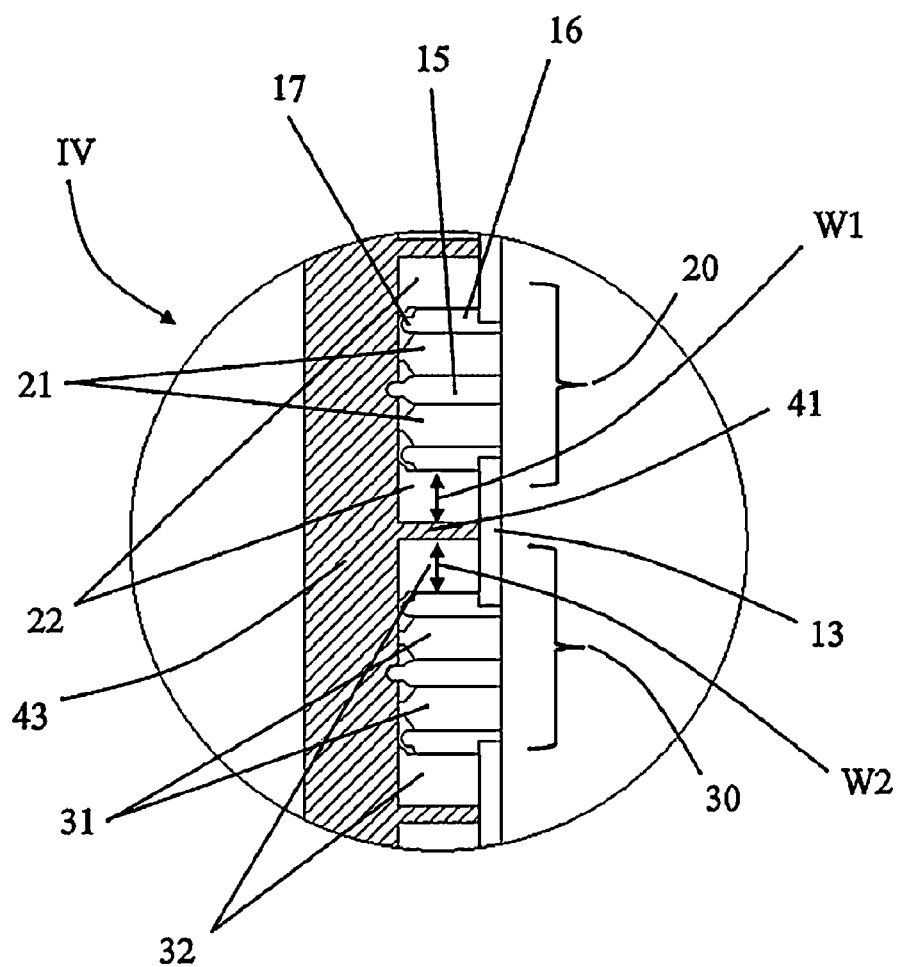
FIG. 4 is a partial enlarged view illustrating region IV of the wiring base of FIG. 3.

FIG. 3 is a plan view of the wiring base 1 of FIG. 1 as viewed from above. FIG. 4 is a partial enlarged view of the wiring base 1 of FIG. 3. As illustrated in FIG. 3 or FIG. 4, a first film 41 extends in the second direction and is positioned between a first grounding conductor 22 and a second grounding conductor 32 adjacent to each other when the first surface 11 is viewed in plan.

If the grounding conductors being positioned between the first differential-wiring channel and the second differential-wiring channel next to each other are integrated into one, a bonding material may be unevenly distributed on the integrated grounding conductor when a lead-out terminal is disposed on the grounding conductor. Uneven distribution of the bonding material may cause the impedances of input-output terminals to be mismatched.

In contrast, the first film 41 is provided in the present disclosure. When the lead-out terminal is joined to a signal conductor or a grounding conductor using the bonding material, the flow of the bonding material is checked at the border between the first film 41 and the signal conductor or the grounding conductor. Accordingly, the spread of the bonding material on the first surface 11 can be reduced. The reduction of the spread of the bonding material reduces the fluctuation of inductance caused by the spread of the bonding material, which can make it easier to achieve impedance matching of the wiring base 1. Successful impedance matching enables the wiring base 1 to transmit high-frequency signals stably. In addition, the reduction of the spread of the bonding material leads to an appropriate formation of the fillet of the bonding material, which can improve the bonding strength between the lead-out terminal and the signal conductor or the grounding conductor and can reduce the variation of the bonding strength. In the drawings, hatching with slant lines highlights the first film 41 and a second film 42, a third film 43, a fourth film 44, and a fifth film 45 (to be described later).

The material of the first film 41 is not specifically limited insofar as the first film 41 can check the flow of the bonding material. For example, the first film 41 may be made of a ceramic material, such as an aluminum oxide-based sintered body, a mullite-based sintered body, a silicon carbide-based sintered body, an aluminum nitride-based sintered body, or a silicon nitride-based sintered body, or of a glass-ceramic material or a chromium based material.

The first film 41 may be such a film of which the wettability with the bonding material is lower than that of the signal conductor and the grounding conductor. When the first film 41 has such properties, the flow of the bonding material can be checked at the border between the first film 41 and the signal conductor or the grounding conductor due to the difference in wettability.

When the first surface 11 is viewed in plan, the first film 41 may be positioned between the first grounding conductor 22 and the second grounding conductor 32 adjacent to each other in such a manner that the first grounding conductor 22 and the second grounding conductor 32 have substantially the same area. In other words, the first grounding conductor 22 and the second grounding conductor 32 are adjacent to each other with the first film 41 interposed therebetween, and the first grounding conductor 22 has a width W1 in the first direction and the second grounding conductor 32 has a width W2 in the first direction. In this case, the width W1 may be equal to the width W2. When the width W1 and the width W2 are the same and when the lead-out terminal is joined to each grounding conductor, the bonding material can be placed more evenly on the grounding conductors, which can cause the bonding strength to be uniform among the grounding conductors and can improve the accuracy in the impedance matching.

The first film 41 may have a width of 0.05 to 0.5 mm in the first direction and a width of 0.3 to 10 mm in the second direction.

Figure 7:
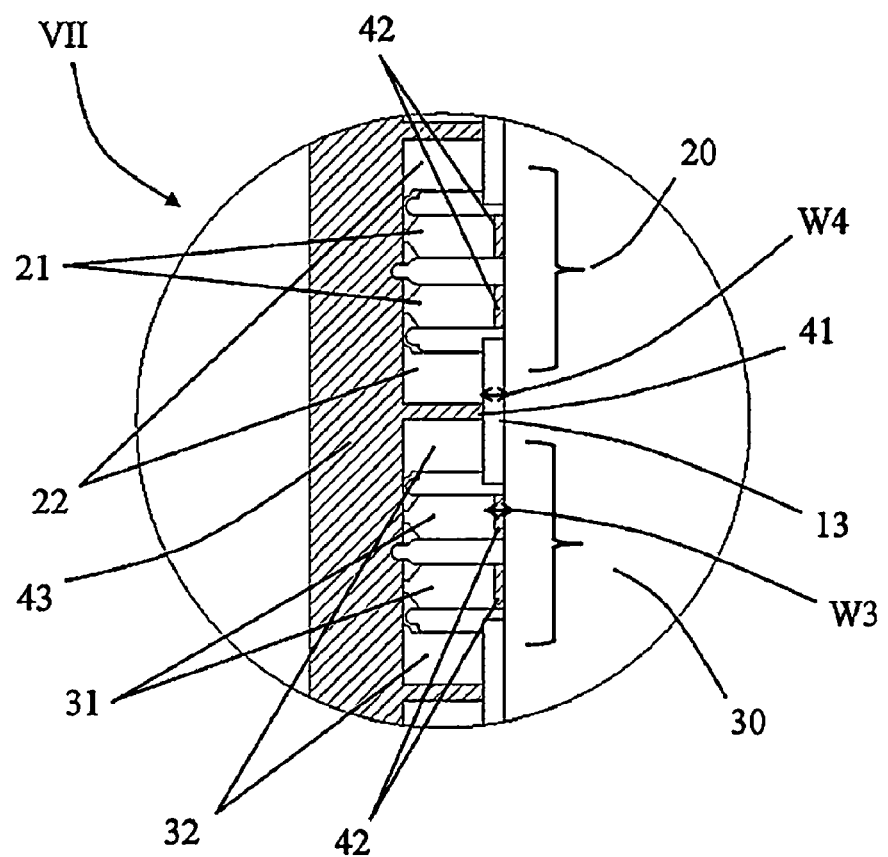
FIG. 7 is a partial enlarged view illustrating region VII of the wiring base of FIG. 6.

FIG. 7 is an enlarged view illustrating part of the wiring base 1 of FIG. 6. As illustrated in FIG. 7, the wiring base 1 may include second films 42 positioned at the periphery of the insulation base 10 and at respective tip ends of the signal conductors when the first surface 11 is viewed in plan. The second films 42, which are positioned at the periphery of the insulation base 10 and at the tip ends of the signal conductors, reduce the likelihood of the signal conductors coming off from the edge of the insulation base 10. The reduced likelihood of the signal conductors coming off enables the wiring base 1 to transmit high-frequency signals stably.

When the first surface 11 is viewed in plan, each second film 42 has a width W3 in the second direction, and the width W3 may be smaller than a width W4 of each first recess 13 in the second direction. This can facilitate fillet formation of the bonding material when the lead-out terminal is joined to the signal conductor, which leads to the improvement of the bonding strength of the lead-out terminal.

The material of the second films 42 may be the same as that of the first films 41. This can reduce the number of processing steps in preparing the wiring base 1. Each second film 42 may have a width of 0.1 to 2 mm in the first direction and a width of 0.05 to 1 mm in the second direction.

As illustrated in FIG. 4, the wiring base 1 may include a third film 43. The third film 43 is positioned closer than the first differential-wiring channel 20 and the second differential-wiring channel 30 to the center of the insulation base 10 when the first surface 11 is viewed in plan. The third film 43 can check the flow of the bonding material toward the center of the wiring base 1 when the bonding material is disposed on the signal conductors and the grounding conductors. This can facilitate appropriate disposal of the bonding material when the lead-out terminal is joined to each of the signal conductors and the grounding conductors, which can stabilize the bonding strength of the lead-out terminal. The first films 41 may be connected to the third film 43. As a result, when the bonding material is disposed on the first grounding conductor 22 and on the second grounding conductor 32 next to the first grounding conductor 22, the bonding material does not flow onto the other conductor, which facilitates appropriate disposal of the bonding material onto each one of the grounding conductors.

The material of the third film 43 may be the same as that of the first films 41. This can reduce the number of processing steps in preparing the wiring base 1. The third film 43 may have a width of 5 to 50 mm in the first direction and a width of 1 to 5 mm in the second direction.

The insulation base 10 may include another conductor having a ground potential on the first surface 11 at a position closer than the third film 43 to the center of the insulation base 10. This increases the area of the grounded surface, which enables the wiring base 1 to have stable high-frequency characteristics. The above phrase "a position closer than the third film 43 to the center of the insulation base 10" means that the position is closer than the third film 43 to the negative side in the y-axis direction.

Figure 5:
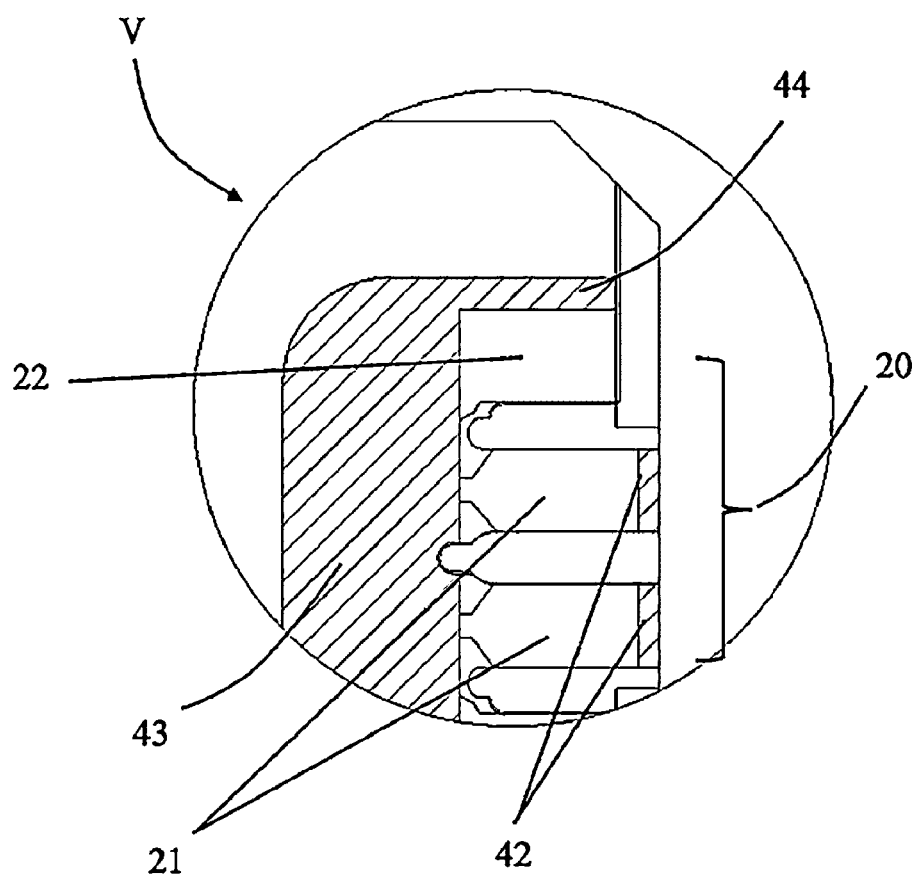
FIG. 5 is a partial enlarged view illustrating region V of the wiring base of FIG. 3.

FIG. 5 is an enlarged view illustrating part of the wiring base 1 of FIG. 3. As illustrated in FIG. 5, the wiring base 1 may include a fourth film 44. The following describes the fourth film 44, on the assumption that differential-wiring channels are arranged in a row in the first direction on the first surface 11 and the first differential-wiring channel 20 is positioned at the end of the row and the second differential-wiring channel 30 is positioned adjacent to the first differential-wiring channel 20. When the first surface 11 is viewed in plan, the fourth film 44 may extend along one of the first grounding conductors 22 in the pair, the one of the first grounding conductors 22 being positioned away from the second grounding conductors 32. The fourth film 44 may be positioned closer than the first differential-wiring channel 20 to the periphery of the insulation base 10 in the first direction. Accordingly, only the first differential-wiring channel 20 is present adjacent to the fourth film 44. Because no differential-wiring channel other than the first differential-wiring channel 20 is present adjacent to the fourth film 44, a bend 441 (to be described later) can be formed in the fourth film 44, and the bend 441 enables the first grounding conductor 22 to expand its area in a direction toward the fourth film 44. The expansion of the area of the first grounding conductor 22 increases the area of the grounded surface, thereby making it easier to achieve impedance matching of the wiring base 1. Successful impedance matching enables the wiring base 1 to transmit high-frequency signals stably.

The fourth film 44 may extend in the second direction and may be connected to the third film 43. This enables an appropriate amount of the bonding material to be disposed on the grounding conductor, which leads to the stabilization of the bonding strength of the lead-out terminal.

Figure 9:
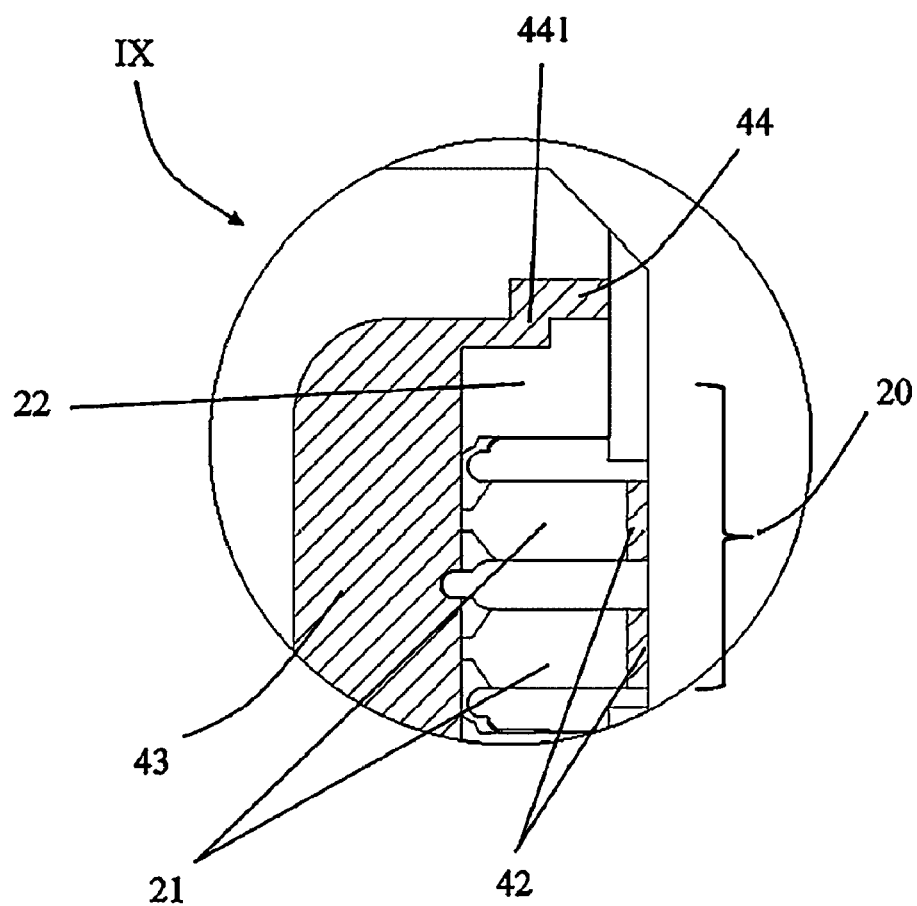
FIG. 9 is a partial enlarged view illustrating region IX of the wiring base of FIG. 6.

The fourth film 44 may have a linear shape or a curved shape. As illustrated in FIG. 9, the fourth film 44 may include the bend 441 that extends in a direction away from the first signal conductor 21 when the first surface 11 is viewed in plan. In other words, the bend 441 extends in a direction away from the first differential-wiring channel 20. The fourth film 44 including the bend 441 can expand the area of the adjacent first grounding conductor 22. The expansion of the area of the first grounding conductor 22 reduces the likelihood of an excess amount of the bonding material being disposed on the first grounding conductor 22 and the likelihood of the bonding material flowing into the first recess 13.

The material of the fourth film 44 may be the same as that of the first films 41. This can reduce the number of processing steps in preparing the wiring base 1. The fourth film 44 may have a width of 0.1 to 2 mm in the first direction and a width of 0.3 to 10 mm in the second direction.

The insulation base 10 may include another conductor having a ground potential on the first surface 11 at a position closer than the fourth film 44 to the periphery of the insulation base 10 in the first direction. This increases the area of the grounded surface, which enables the wiring base 1 to have stable high-frequency characteristics.

Figure 8:
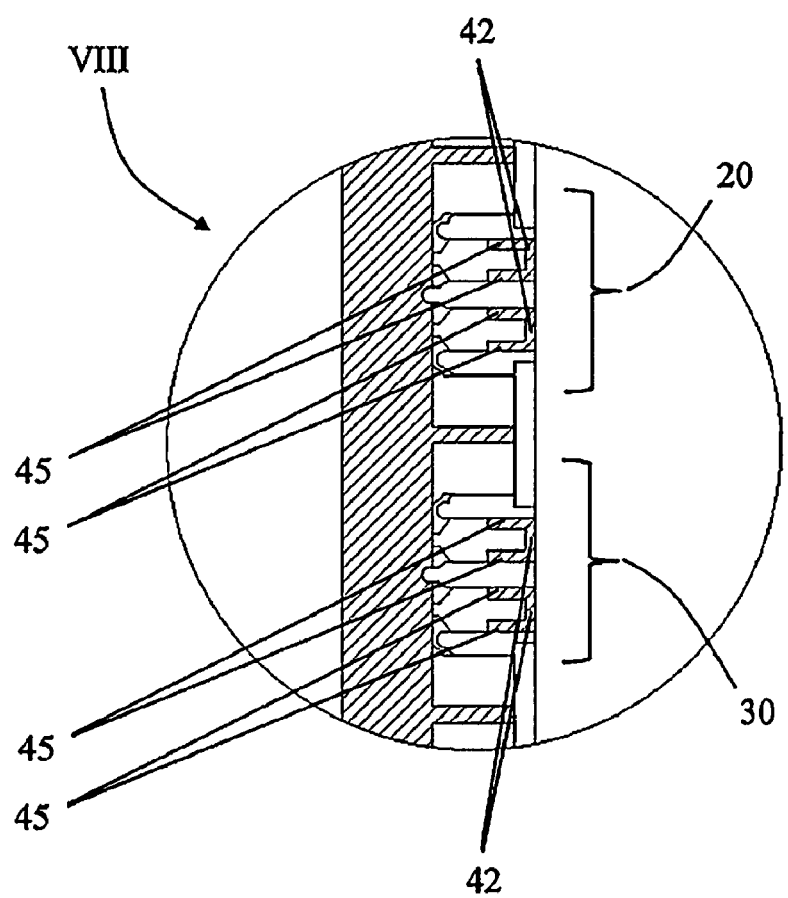
FIG. 8 is a partial enlarged view illustrating region VIII of the wiring base of FIG. 6.

FIG. 8 is an enlarged view illustrating part of the wiring base 1 of FIG. 6. As illustrated in FIG. 8, the wiring base 1 may include fifth films 45 that are positioned at the periphery of each signal conductor and extend in the second direction when the first surface 11 is viewed in plan. The fifth films 45, which are formed at the periphery of each signal conductor and extending in the second direction, can reduce the likelihood of the signal conductor coming off in the second direction from the edge of the insulation base 10. The reduced likelihood of the signal conductors coming off enables the wiring base 1 to transmit high-frequency signals stably.

The fifth films 45 may extend in the second direction and may be connected to each of the second films 42. Accordingly, the fifth films 45 and the second film 42 are formed continuously at the edge of each signal conductor, which further reduces the likelihood of the signal conductor coming off.

The material of the fifth films 45 is the same as that of the first films 41. This can reduce the number of processing steps in preparing the wiring base 1. Each fifth film 45 may have a width of 0.02 to 0.5 mm in the first direction and a width of 0.1 to 2 mm in the second direction.

Figure 2:
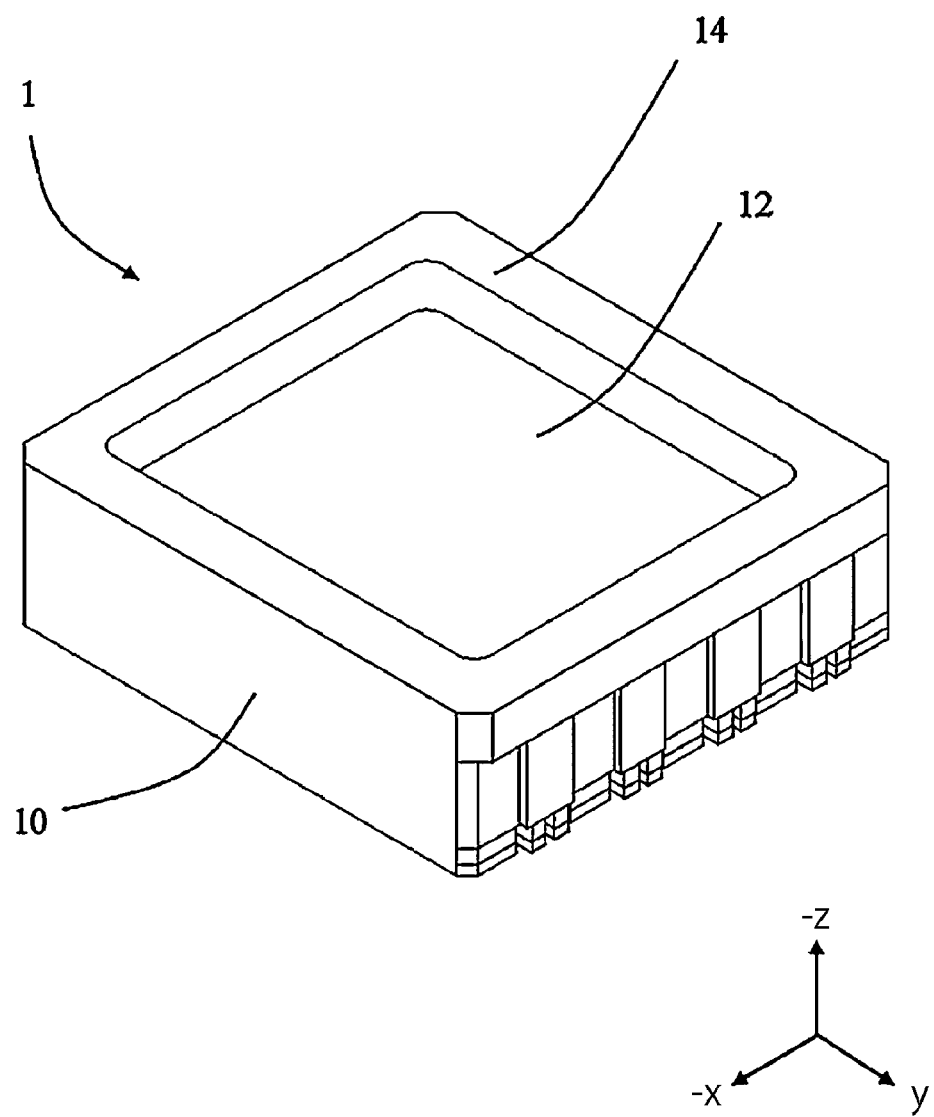
FIG. 2 is a perspective view illustrating the wiring base according to the embodiment of the present disclosure as viewed from below.

The insulation base 10 may have the first surface 11 and a mounting portion 12 on which an electronic component 101 is mounted. The mounting portion 12 may be an integral part of the insulation base 10. When the insulation base 10 includes the mounting portion 12, the mounting portion 12 may be positioned on the first surface 11 or on a surface opposite to the first surface 11. Note that FIG. 2 illustrates an example of the wiring base 1 in which the mounting portion 12 and the insulation base 10 are formed integrally. The mounting portion 12 may be positioned on a substrate that is provided separately from the insulation base 10.

Figure 10:
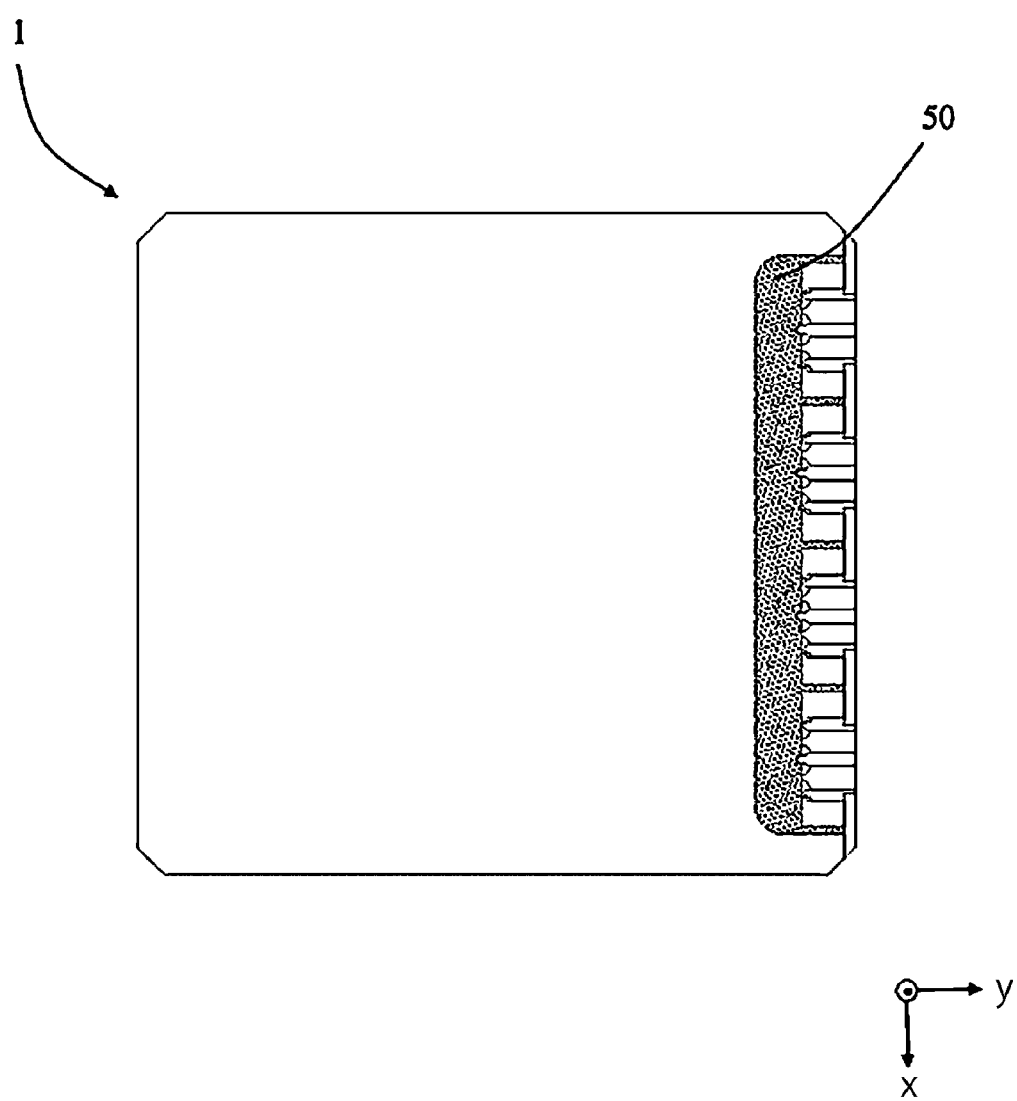
FIG. 10 is an exploded perspective view illustrating the wiring base of FIG. 1.

As illustrated in FIG. 10, a third grounding conductor 50 is positioned between the first surface 11 and the first films 41, the second films 42, the third film 43, the fourth films 44, and the fifth films 45. The first films 41, the second films 42, the third film 43, the fourth films 44, and the fifth films 45 may be positioned on the third grounding conductor 50. The third grounding conductor 50 is connected to the first grounding conductors 22 and to the second grounding conductors 32. Providing the third grounding conductor 50 can increase the area of the grounded surface of the differential-wiring channel, which enables the wiring base 1 to transmit high-frequency signals stably. In FIG. 10, hatching with dots highlights the third grounding conductor 50.

The third grounding conductor 50 may be shaped so as to follow the shapes of the first films 41, the second films 42, the third film 43, the fourth films 44, and the fifth films 45 that are positioned on the third grounding conductor 50.

The third grounding conductor 50 may be a metallized layer formed on the first surface 11. The metallized layer may contain tungsten (W), molybdenum (Mo), manganese (Mn), silver (Ag), or copper (Cu) and may be plated with nickel or gold. The metallized layer may be made of an alloy or the like containing at least one of the above metals.

As viewed in plan, the substrate may be shaped like a rectangle, and the size of the substrate may range from 5 mm by 10 mm to 50 mm by 50 mm.

For example, the substrate may contain a metal, such as iron (Fe), copper (Cu), nickel (Ni), chromium (Cr), cobalt (Co), molybdenum (Mo), or tungsten (W), or an alloy thereof. When the substrate contains such a metallic material, the substrate can be prepared by processing an ingot of the metallic material using metal rolling, punching, or the like. The substrate may contain a dielectric material. For example, the dielectric material may be a ceramic material, such as an aluminum oxide-based sintered body, a mullite-based sintered body, a silicon carbide-based sintered body, an aluminum nitride-based sintered body, or a silicon nitride-based sintered body, or may be a glass-ceramic material. When the substrate contains the dielectric material, the surface of the substrate may be plated with nickel or gold. Nickel or gold plating on the surface of the substrate can improve the wettability with the bonding material and the corrosion and weather resistances of the substrate.

The insulation base 10 may include a frame 14 that surrounds the mounting portion 12. If the mounting portion 12 and the insulation base 10 are formed integrally, the frame 14 may be formed integrally with the insulation base 10. If the mounting portion 12 and the insulation base 10 are formed separately, the frame 14 may be formed separately from the insulation base 10. Note that FIG. 2 illustrates an example of the wiring base 1 in which the frame 14 and the insulation base 10 are formed integrally.

As viewed in plan, the frame 14 may be shaped like a rectangle or the letter U, and the size of the frame 14 may be from 5 mm by 10 mm to 50 mm by 50 mm. The height may be from 2 mm to 15 mm. The thickness of the frame 14 may be from 0.5 mm to 2 mm.

For example, the frame 14 may contain a metal, such as iron (Fe), copper (Cu), nickel (Ni), chromium (Cr), cobalt (Co), molybdenum (Mo), or tungsten (W), or an alloy thereof. When the frame 14 contains such a metallic material, the frame 14 can be prepared by processing an ingot of the metallic material using metal rolling, punching, or the like. The frame 14 may contain a dielectric material. For example, the dielectric material may be a ceramic material, such as an aluminum oxide-based sintered body, a mullite-based sintered body, a silicon carbide-based sintered body, an aluminum nitride-based sintered body, or a silicon nitride-based sintered body, or may be a glass-ceramic material. When the frame 14 contains the dielectric material, the surface of the frame 14 may be plated with nickel or gold. Nickel or gold plating on the surface of the frame 14 can improve the wettability with the bonding material and the corrosion and weather resistances of the frame 14.

When the mounting portion 12 and the frame 14 are formed separately from the insulation base 10, the side walls of the frame 14 may include an engagement portion for engagement with the wiring base 1. The engagement portion may pierce the frame 14 in a direction parallel to the mounting surface of the mounting portion 12 on which the electronic component 101 is mounted so as to connect the inside of the frame 14 to the outside.

The insulation base 10 may contain other conductors between insulation layers thereof. For example, when the first surface 11 is viewed through in plan view, other conductors present between the insulation layers may be positioned around the first recesses 13, the second recesses 15, the third recesses 16, or may be positioned so as to overlap the signal conductors and the grounding conductors. Moreover, other conductors present between the insulation layers may be electrically connected to one another using the first recesses 13, the second recesses 15, the third recesses 16, or using via conductors and the like. Other conductors present between the insulation layers may be connected, using via conductors and the like, to the signal conductors, the grounding conductors, or other conductors that are positioned on the first surface 11. When the via conductors connect other conductors present between the insulation layers to the signal conductors or the grounding conductors, the other conductors present between the insulation layers need to be disposed so as to avoid short-circuiting between the signal conductors and the grounding conductors. Note that the phrase "an object is viewed through in plan view" as used herein means that the object is viewed through when an arbitrary surface of the object is viewed in plan. This expression may be used to describe a positional relationship between components in different depths.

<Structure of Electronic Device 100>

Figure 11:
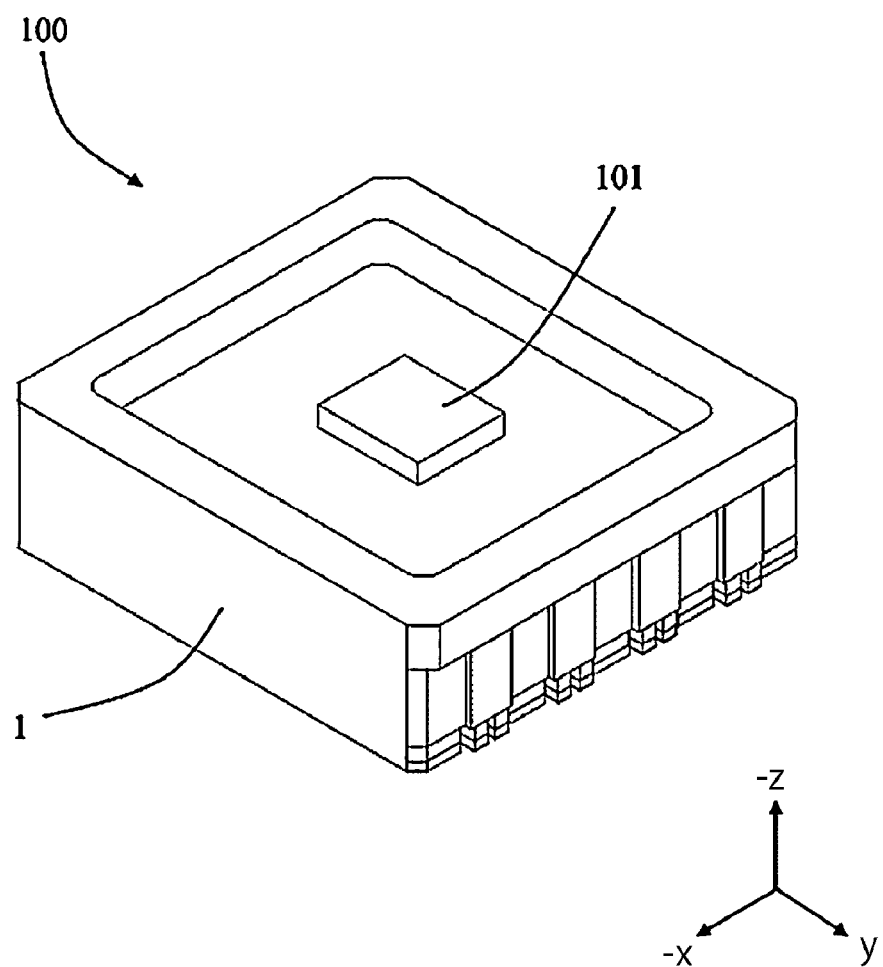
FIG. 11 is a perspective view illustrating an electronic device according to an embodiment of the present disclosure as viewed from below.
Figure 12:
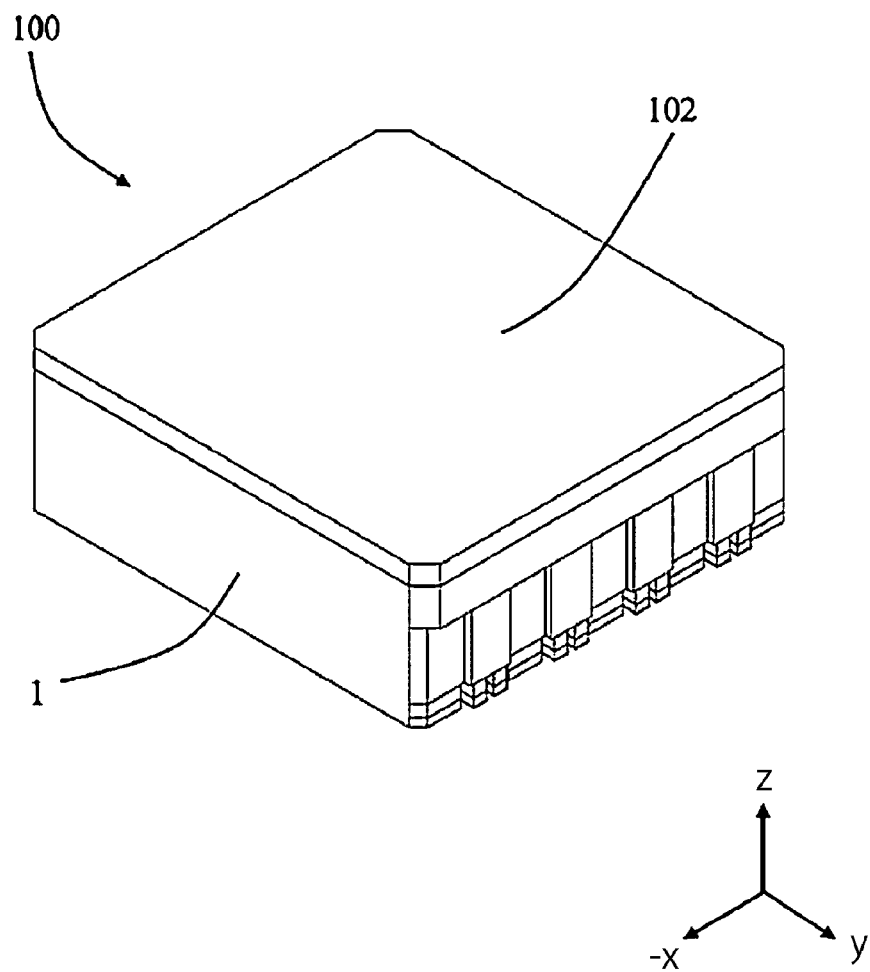
FIG. 12 is a perspective view, as viewed from below, illustrating the electronic device of FIG. 10 that further includes a lid.

The electronic device 100 illustrated in FIG. 11 includes the wiring base 1 and the electronic component 101. The electronic device 100 illustrated in FIG. 12 further includes a lid 102.

For example, the electronic component 101 may be a capacitor or an optoelectronic semiconductor, such as a laser diode (LD) or a photo diode (PD). The electronic component 101 may be a light-emitting element, such as a light emitting diode (LED), or an integrated circuit, such as a large-scale integrated circuit (LSI).

The electronic component 101 is mounted on the mounting portion 12. For example, the electronic component 101 is coupled to the wiring base 1 using bonding wires or the flip-chip technology.

The lid 102 may be positioned above the frame 14 and cover the electronic device 100. In this case, the lid 102 may seal the electronic device 100. When the first surface 11 is viewed in plan, the lid 102 may be shaped like a rectangle having a size ranging from 5 by 10 mm to 50 by 50 mm. The thickness of the lid 102 may range from 0.5 to 2 mm. For example, the lid 102 may contain a metal, such as iron (Fe), copper (Cu), nickel (Ni), chromium (Cr), cobalt (Co), molybdenum (Mo), or tungsten (W), or an alloy thereof. Metallic members of the lid 102 can be prepared by processing an ingot of such a metallic material using metal rolling, punching, or the like.

<Method of Manufacturing Wiring Base 1 and Electronic Device 100>

The following describes an example method of manufacturing the wiring base 1 and the electronic device 100 according to an embodiment of the present disclosure. Note that the present specification describes an example method of manufacturing the wiring base 1 in which the mounting portion 12 and the frame 14 are integrally formed with the wiring base 1.

(1) A slurry is prepared by adding, for example, an appropriate organic binder and solvent to raw-material powders of aluminum oxide, silicon oxide, and the like and by mixing the materials. The slurry prepared is subsequently formed into multiple ceramic green sheets using, for example, the doctor-blade method. Here, grooves may be formed in a ceramic green sheet at predetermined positions. The grooves later become the first recesses 13, the second recesses 15, and the third recesses 16. Grooves may be formed at predetermined positions of the ceramic green sheet using a die, punching, laser light, or the like, to form the first recesses 13, the second recesses 15, the third recesses 16, the hollows 17, the mounting portion 12, and the frame 14.

(2) A metal paste is applied, using screen printing or the like, to portions of the ceramic green sheet obtained in the step (1). The portions later become the first differential-wiring channel 20, the second differential-wiring channel 30, the third grounding conductor 50, and other conductors. The metal paste is prepared by mixing a metal powder containing above-described metallic materials with an appropriate organic binder and solvent so as to obtain an appropriate consistency of the metal paste. The metal paste may contain glass or ceramics to increase the strength of bonding with the insulation base 10. In forming the via conductors, through holes are formed at appropriate positions of the ceramic green sheet in the step (1), and subsequently the through holes are filled with the metal paste to be used to form the first differential-wiring channel 20, the second differential-wiring channel 30, and other conductors.

(3) The ceramic green sheets above are laminated and then pressed together.

(4) The ceramic green sheet laminated is baked in a reducing atmosphere at about 1600° C. The ceramic green sheet is subsequently processed using cutting or punching to have an appropriate shape. Thus, the insulation base 10 having a desirable shape is obtained. Note that grooves have been formed in the step (1) at positions corresponding to the first recesses 13, the second recesses 15, the third recesses 16, the hollows 17, the mounting portion 12, and the frame 14. Thus, the first recesses 13, the second recesses 15, the third recesses 16, the hollows 17, the mounting portion 12, and the frame 14 can be obtained after baking. The metallic paste is applied to, or filled in, the above-described portions in the step (2) to obtain, after the step (4), the first differential-wiring channel 20, the second differential-wiring channel 30, the third grounding conductor 50, and other conductors or via conductors.

(5) Plating and other processing are performed on the surface of the insulation base 10 obtained in the step (4). The surface of the insulation base 10 may be plated with nickel or gold. Nickel or gold plating on the surface can improve the wettability with the bonding material and the corrosion and weather resistances of the insulation base 10.

(6) Next, the surface of the insulation base 10 is processed to form the first films 41, the second films 42, the third film 43, the fourth films 44, and the fifth films 45.

(7) The electronic component 101 is subsequently mounted on the mounting portion 12. The electronic component 101 is electrically connected to the wiring base 1, for example, by wire bonding. The electronic component 101 may be fixed onto the mounting portion 12 by applying an adhesive or the like. The electronic device 100 and the lid 102 may be joined to each other using the bonding material after the electronic component 101 is mounted on the mounting portion 12.

The wiring base 1 is thus manufactured through the steps (1) to (7). The electronic device 100 can be manufactured by mounting the electronic component 101 onto the mounting portion 12 of the wiring base 1. Note that the execution order of the steps (1) to (7) and the number of executions in each step are not specifically limited.

The wiring base 1 and the electronic device 100 of the present disclosure are not limited to the above-described embodiments but may be altered in various ways without departing from the gist of the present disclosure. All the alterations and modifications that fall within the scope of the claims are included in the present disclosure.

INDUSTRIAL APPLICABILITY

The present disclosure is applicable to wiring bases and to electronic devices.

REFERENCE SIGNS 1 wiring base
10 insulation base
11 first surface
12 mounting portion
13 first recess
14 frame
15 second recess
16 third recess
17 hollow
20 first differential-wiring channel
21 first signal conductor 22 first grounding conductor
30 second differential-wiring channel
31 second signal conductor
32 second grounding conductor
41 first film
42 second film
43 third film
44 fourth film
45 fifth film
50 third grounding conductor
100 electronic device
101 electronic component
102 lid

The invention claimed is:

1. A wiring base comprising:
an insulation base having a first surface;
a first differential-wiring channel positioned on the first surface; and
a second differential-wiring channel positioned on the first surface, the first differential-wiring channel and the second differential-wiring channel being arranged side by side in a first direction,
wherein the first differential-wiring channel comprises
a pair of first signal conductors extending in a second direction intersecting the first direction, and
a pair of first grounding conductors extending along the first signal conductors with the first signal conductors being interposed between the first grounding conductors, and
wherein the second differential-wiring channel comprises
a pair of second signal conductors extending in the second direction, and
a pair of second grounding conductors extending along the second signal conductors with the second signal conductors being interposed between the second grounding conductors,
the wiring base further comprising a first film extending in the second direction and positioned between a first grounding conductor and a second grounding conductor adjacent to each other when the first surface is viewed in plan,
wherein the first grounding conductor adjacent to the first film has a width W1 in the first direction, and the second grounding conductor has a width W2 in the first direction, the second grounding conductor being adjacent to the first grounding conductor with the first film being interposed between the second grounding conductor and the first grounding conductor, and
wherein the width W1 is equal to the width W2.

2. The wiring base according to claim 1, further comprising:
a third grounding conductor positioned between the first film and the first surface,
wherein the third grounding conductor is connected to the first grounding conductors and to the second grounding conductors.

3. The wiring base according to claim 1, further comprising:
second films positioned at a periphery of the insulation base and at respective tip ends of the first signal conductors when the first surface is viewed in plan.

4. The wiring base according to claim 3,
wherein the second films are made of a same material as a material of the first films.

5. The wiring base according to claim 3, further comprising:
fifth films positioned at respective peripheries of the first signal conductors when the first surface is viewed in plan, the fifth films extending in the second direction from respective ones of the second films.

6. The wiring base according to claim 1,
wherein the insulation base comprises first recesses positioned at a periphery of the insulation base and at respective tip ends of the first grounding conductors when the first surface is viewed in plan.

7. The wiring base according to claim 6,
wherein when the first surface is viewed in plan, each of the second films has a width W3 in the second direction and each of the first recesses has a width W4 in the second direction, and
wherein the width W3 is smaller than the width W4.

8. The wiring base according to claim 1, further comprising:
a third film positioned closer than the first differential-wiring channel and the second differential-wiring channel to a center of the insulation base when the first surface 11 is viewed in plan, the third film being connected to the first film.

9. The wiring base according to claim 8, further comprising:
a fourth film adjacent to a first grounding conductor of the pair of first grounding conductors, the first grounding conductor being positioned away from the second grounding conductors when the first surface is viewed in plan, the fourth film extending in the second direction from the third film.

10. The wiring base according to claim 9,
wherein the fourth film is positioned closer than the first differential-wiring channel to a periphery of the insulation base in the first direction.

11. The wiring base according to claim 9,
wherein the fourth film comprises a bend when the first surface is viewed in plan.

12. The wiring base according to claim 11,
wherein the bend extends in a direction away from the first signal conductors.

13. An electronic device comprising:
the wiring base according to claim 1; and
an electronic component connected to the wiring base.

* * * * *